United States Patent
Li et al.

(10) Patent No.: US 8,194,366 B1
(45) Date of Patent: Jun. 5, 2012

(54) TMR READ HEAD STRUCTURES WITH DIFFERENTIAL STRIPE HEIGHTS

(75) Inventors: Shaoping Li, San Ramon, CA (US); Yimin Guo, San Jose, CA (US); Feng Liu, San Ramon, CA (US); Wei Zhang, Fremont, CA (US); Sining Mao, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 339 days.

(21) Appl. No.: 12/579,315

(22) Filed: Oct. 14, 2009

(51) Int. Cl.
*G11B 5/33* (2006.01)

(52) U.S. Cl. .................................................. 360/324.2

(58) Field of Classification Search ............... 360/324.2
See application file for complete search history.

(56) References Cited

U.S. PATENT DOCUMENTS

| | | | |
|---|---|---|---|
| 6,466,419 B1 | 10/2002 | Mao | |
| 6,654,209 B2 | 11/2003 | Seigler et al. | |
| 6,700,760 B1 | 3/2004 | Mao | |
| 6,781,801 B2 | 8/2004 | Heinonen et al. | |
| 6,791,805 B2 | 9/2004 | Heinonen et al. | |
| 6,870,717 B2 * | 3/2005 | Childress et al. | 360/324.2 |
| 6,999,270 B2 | 2/2006 | Watanabe et al. | |
| 7,027,272 B2 | 4/2006 | Furukawa et al. | |
| 7,057,862 B2 | 6/2006 | Kasiraj et al. | |
| 7,106,561 B2 | 9/2006 | Carey et al. | |
| 7,133,264 B2 | 11/2006 | Mauri et al. | |
| 7,151,654 B1 | 12/2006 | Mao et al. | |
| 7,199,984 B2 | 4/2007 | Carey et al. | |
| 7,220,499 B2 | 5/2007 | Saito et al. | |
| 7,246,427 B2 | 7/2007 | Guo et al. | |
| 7,333,305 B2 * | 2/2008 | Gill | 360/324.12 |
| 7,369,371 B2 * | 5/2008 | Freitag et al. | 360/324.11 |
| 7,405,909 B2 * | 7/2008 | Gill | 360/324.12 |
| 7,436,637 B2 * | 10/2008 | Pinarbasi | 360/324.11 |
| 7,602,589 B2 * | 10/2009 | Freitag et al. | 360/324.11 |
| 7,961,440 B2 * | 6/2011 | Gill et al. | 360/324.11 |
| 2002/0051330 A1 | 5/2002 | Heijden et al. | |
| 2003/0197987 A1 | 10/2003 | Saito | |
| 2003/0231436 A1 | 12/2003 | Nishiyama | |
| 2005/0280955 A1 | 12/2005 | Hasegawa et al. | |
| 2006/0044705 A1 | 3/2006 | Hasegawa et al. | |
| 2006/0209473 A1 | 9/2006 | Oshima et al. | |
| 2007/0030592 A1 | 2/2007 | Shintani et al. | |
| 2007/0076331 A1 * | 4/2007 | Pinarbasi | 360/324.11 |
| 2007/0091511 A1 | 4/2007 | Hoshiya et al. | |
| 2007/0097558 A1 | 5/2007 | Carey et al. | |

* cited by examiner

*Primary Examiner* — Mark Blouin

(57) ABSTRACT

A tunneling magnetoresistance (TMR) read head and a method of producing the same are disclosed. A free layer having a free layer stripe height is provided, the free layer having a first side and a second side. A tunneling barrier layer is formed adjacent to the first side of the free layer, the tunneling barrier layer having a first side and a second side, the second side of the tunneling barrier layer facing the first side of the free layer. A pinned stack is formed adjacent to the first side of the tunneling barrier layer. The pinned stack comprises at least one magnetic layer having a current path stripe height that is less than the free layer stripe height.

20 Claims, 8 Drawing Sheets

TMR READ HEAD STRUCTURES WITH DIFFERENTIAL STRIPE HEIGHTS

FIELD OF THE INVENTION

The present invention generally relates to magnetic transducers and, in particular, relates to TMR read head structures with differential stripe heights.

BACKGROUND OF THE INVENTION

Tunnel magnetoresistance (TMR) read sensors, such as current-perpendicular-to-plane (CPP) TMR read sensors, are frequently employed as magnetoresistive sensors in the magnetic read heads of hard disk drives. Thermal magnetization fluctuations, also known as magnetic noise, in the ferromagnetic free layer of TMR read sensors have been recognized as a significant source of intrinsic head noise. In a TMR read sensor, the magnetic noise scales inversely with the read sensor's volume. It is believed that the magnetic noise poses a fundamental limit to signal-to-noise ratio (SNR) of a magnetic recording system.

One of major problems in future generation of TMR read sensor devices is to obtain the highest $\Delta R/R$ of the magnetoresistance or high utilization factor while further reducing the magnetic noise. However, the magnetic noise increases as the read sensor's dimension is scaled down, and the enhancement of permanent magnet (PM) strength leads to reduction of the utilization factor.

Recently, one of the thrust areas in the TMR read sensor development has been in the reduction of sensor dimensions while maintaining a sizable $\Delta R/R$ (e.g., >100%) by optimizing fabrication process. However, as the read sensor dimensions are further reduced, the magnetic noise issue becomes more and more significant in terms of the read sensor's SNR performance.

SUMMARY OF THE INVENTION

Various embodiments of the subject disclosure address the magnetic noise issue associated with reduced TMR read sensor dimensions by providing a novel TMR read sensor structure in which a free layer stripe height is larger than a current path stripe height. Such a differential stripe-height structure can drastically reduce the magnetic noise while increasing the read sensitivity or utilization factor. Therefore, differential stripe-height TMR read sensor structures of the present disclosure can be suitable for high recording density (e.g., 1000 to 1500 Gbit/in$^2$) application and beyond. The subject disclosure also describes a double lift-off integration process that can be used to produce such a differential stripe-height TMR read sensor structure.

According to one embodiment of the subject disclosure, a tunneling magnetoresistance (TMR) read head is provided. The TMR read head can comprise a free layer having a free layer stripe height, the free layer having a first side and a second side. The TMR read head can further comprise a pinned stack disposed adjacent to the first side of the free layer. The pinned stack can comprise at least one magnetic layer having a current path stripe height that is less than the free layer stripe height.

According to one embodiment of the subject disclosure, a method of producing a tunneling magnetoresistance (TMR) read head is disclosed. The method can comprise providing a free layer having a free layer stripe height, the free layer having a first side and a second side. The method can further comprise forming a tunneling barrier layer adjacent to the first side of the free layer, the tunneling barrier layer having a first side and a second side, the second side of the tunneling barrier layer facing the first side of the free layer. The method can further comprise forming a pinned stack adjacent to the first side of the free layer. The pinned stack can comprise at least one magnetic layer having a current path stripe height that is less than the free layer stripe height.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

DETAILED DESCRIPTION OF THE INVENTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail to avoid unnecessarily obscuring the present invention.

Figure 1:
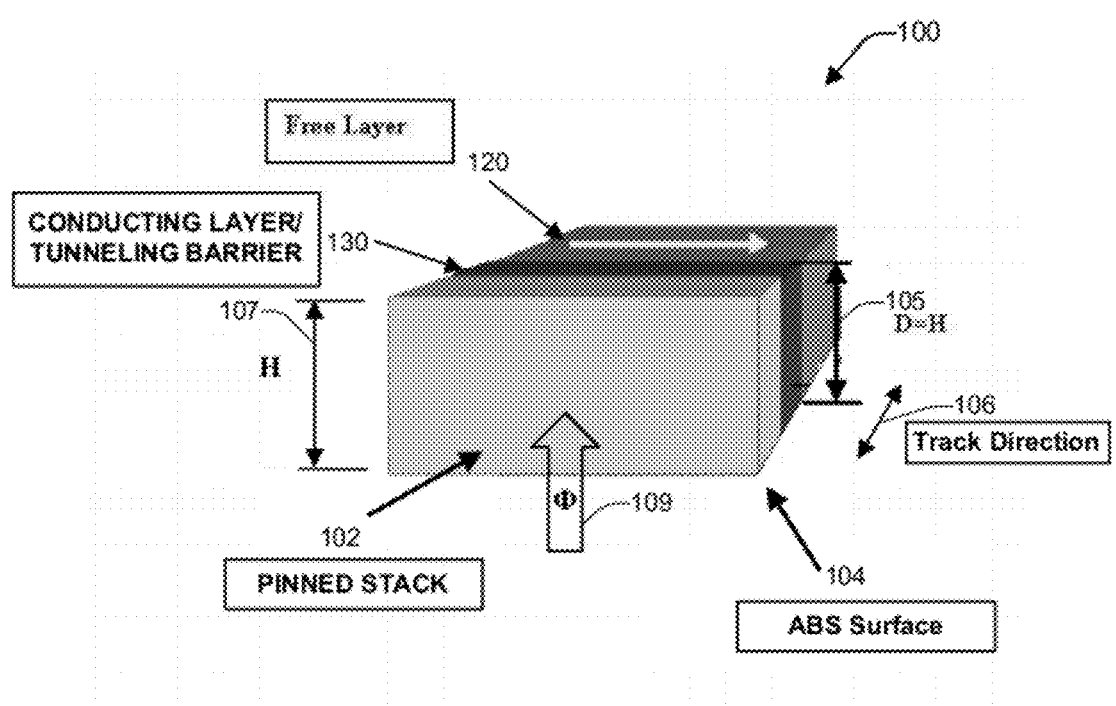
FIG. 1 is a perspective view of a conventional TMR sensing element which has a uniform stripe height across the track direction.

FIG. 1 is a perspective view of a conventional TMR sensing element 100 (e.g., a CPP read element) which has a uniform stripe height across a track direction 106. The conventional TMR sensing element 100 has a plurality of magnetic layers including a free layer 120, a pinned stack 102, and a tunneling barrier layer 130 disposed between the free layer 120 and the pinned stack 102. The free layer 120 has a free layer stripe height (D) 105, and the pinned stack 102 has a current path stripe height (H) 107. In the conventional TMR sensing element 100, the free layer stripe height (D) 105 is same as or comparable to the current path stripe height (H) 107.

Figure 2:
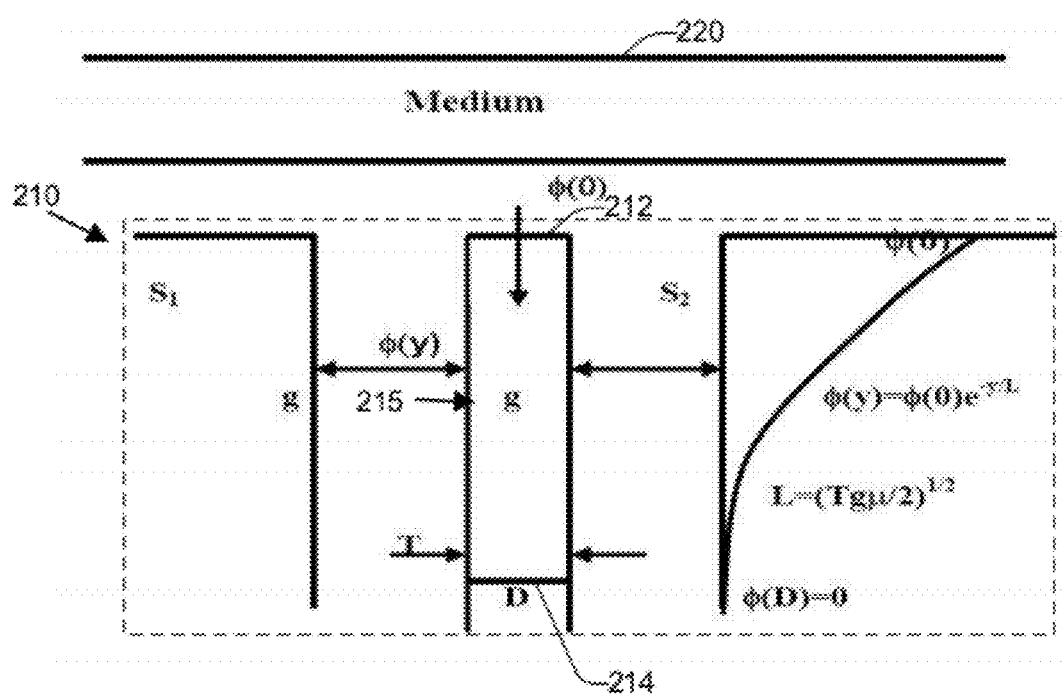
FIG. 2 is a graph illustrating a linear decay of magnetic flux with the depth of height for a TMR sensing element with a uniform stripe height when the free layer stripe height is comparable to the magnetic transmission line characteristic length.

In order to obtain an optimized performance, the uniform read stripe height (e.g., D and H) of the conventional TMR sensing element 100 is typically less than or equal to L, a decay length of a magnetic flux ($\Phi$) 109 emanating from a magnetic recording media (not shown). L can be expressed $(Tg\mu/2)^{1/2}$, where T is the total thickness of the magnetic layers, $\mu$ is the permeability of those magnetic layers, and g is a half gap distance 215 as shown in FIG. 2. For example, FIG. 2 shows a TMR sensor structure 210 having a first surface 212 disposed proximate to a magnetic recording medium 220 and a second surface 214 disposed opposite to the first surface 212 at a uniform stripe height (D) from the first surface, wherein a magnetic flux emanating from the magnetic recording medium has a first magnetic flux value at the first surface 212 and a second magnetic flux value at the second surface 214. In the described situation, the magnetic flux ($\Phi$) becomes zero at the second surface 214 (e.g., at the uniform stripe height (D)), analogous to an open-circuited electric transmission line. Provided that the TMR sensor structure 210 is shielded and the condition D<L is satisfied, the maximum average flux in the sensor structure 210 is always close to 0.5 $\Phi$(0) regardless of the actual stripe height D.

Figure 3:
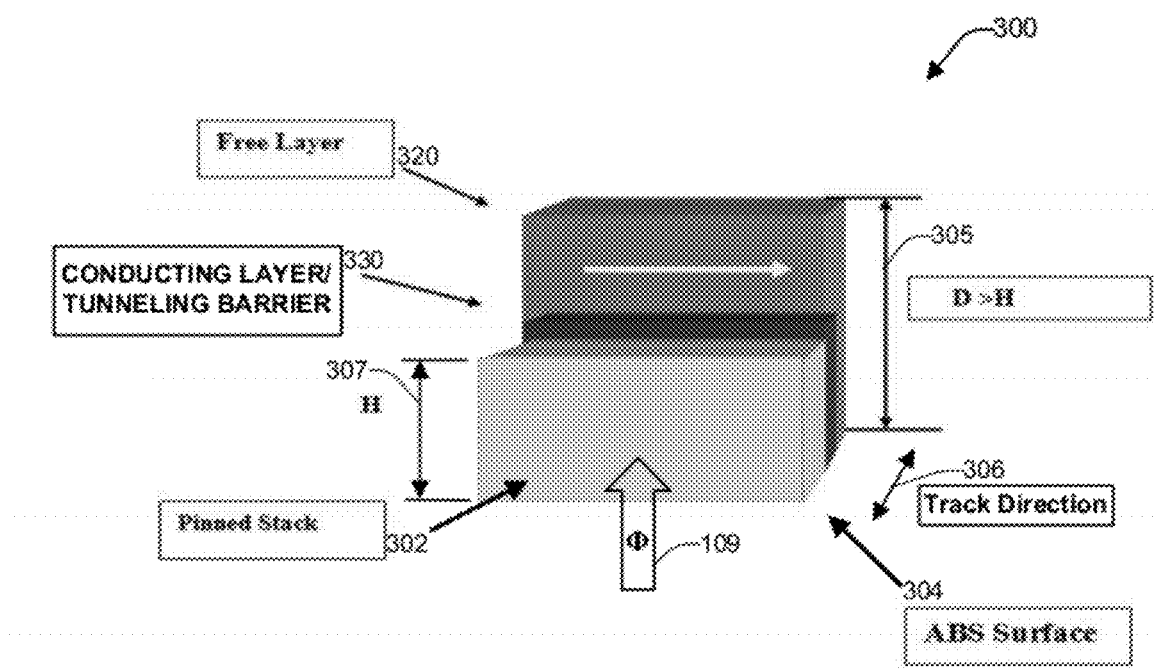
FIG. 3 is a perspective view of a novel TMR sensing element which has differential stripe heights across a track direction according to one aspect of the subject disclosure.

FIG. 3 is a perspective view of a novel TMR sensing element 300 (e.g., a CPP read element) which has two or more differential stripe heights across a track direction 306 according to one aspect of the subject disclosure. The TMR sensing element 300 has a plurality of magnetic layers including a free layer 320, a pinned stack 302, and a tunneling (junction) barrier 330 disposed between the free layer 320 and the pinned stack 302. The free layer 320 has a free layer stripe height (D) 305, and the pinned stack 302 has a current path stripe height (H) 307. In the illustrated example, the free layer stripe height (D) 305 is larger than the current path stripe height (H) 307. In certain embodiments, D 305 is between 20 to 200% larger than H 307. In some of such embodiments, D 305 is between about 50-100% larger than H 307.

By a proper control of D 305, the magnetic flux ($\Phi$) 109 can be made nonzero at the end of an electric current path (e.g., at the height of H) in the free layer 305. As a result, the maximum average flux through the electric current path of the TMR sensing element 300 can be manipulated to be much larger than 0.5 $\Phi$(0) owing to the fact that $\Phi$(H), the magnetic flux at H, is nonzero. The increase in maximum average flux results in a number of performance benefits including, but not limited to, achieving a large effective utilization factor, and an improved signal-to-noise ratio (SNR) due to an increase in signal a large free layer volume achieved by having the free layer stripe height (D 305) substantially larger than the current stripe height (H 307).

Results of a micromagnetic simulation show that a net increase of at least 20-30% in readback signal can be achieved by the use of such a TMR sensing element having differential stripe heights in a CPP TMR read head. For example, the micromagnetic simulation results show that under the same shield-to-shield spacing (d 409 FIG. 4) and the same pinned layer size, a free layer having a size of 0.04 µm×0.1 µm yields an amplitude of 7,000 µV while a free layer having a size of 0.04 µm×0.04 µm could only yield an amplitude of 4,300 µV for media magnetic field strength of 0.85 µT, resulting in an amplitude increase of 20-35% without increasing the magnetic noise.

Those skilled in the art will appreciate that the design approach of the subject disclosure can lead to reduced dimensions for a TMR sensing element and hence the overall dimensions of a CPP read head that includes the TMR sensing element. Those skilled in the art will also appreciate that the design approach of the subject disclosure is entirely different from the flux-guide design for CPP reader sensors. According to the subject disclosure, a selective sensitivity of a TMR/GMR sensing element is enhanced by the differential stripe heights because the thermal fluctuation is isotropic in general. Additional advantages associated with the design approach of the subject disclosure include a reduction in the non-uniform edge pinning effect on free layer magnetic moment rotation, which in turn further improves the TMR free layer's selective sensitivity and amplitude symmetry. This would be especially true as the dimensions of TMR read heads (including both stripe height and read width) are further minimized. Furthermore, with the shrinking TMR sensing device stripe height, a coherent rotation process of the free layer magnetic moment can become more difficult due to an increase in a demagnetization field. In TMR sensing elements of the subject disclosure, the height of free layer (D) is larger than the height of pinned layer (H). Therefore, the stiffness for the coherent rotation in the free layer of the TMR sensing element of the subject disclosure is expected to be smaller than that in the free layer of a conventional TMR sensing element that has comparable stripe heights for both the free layer and the pinned stack.

Figure 4:
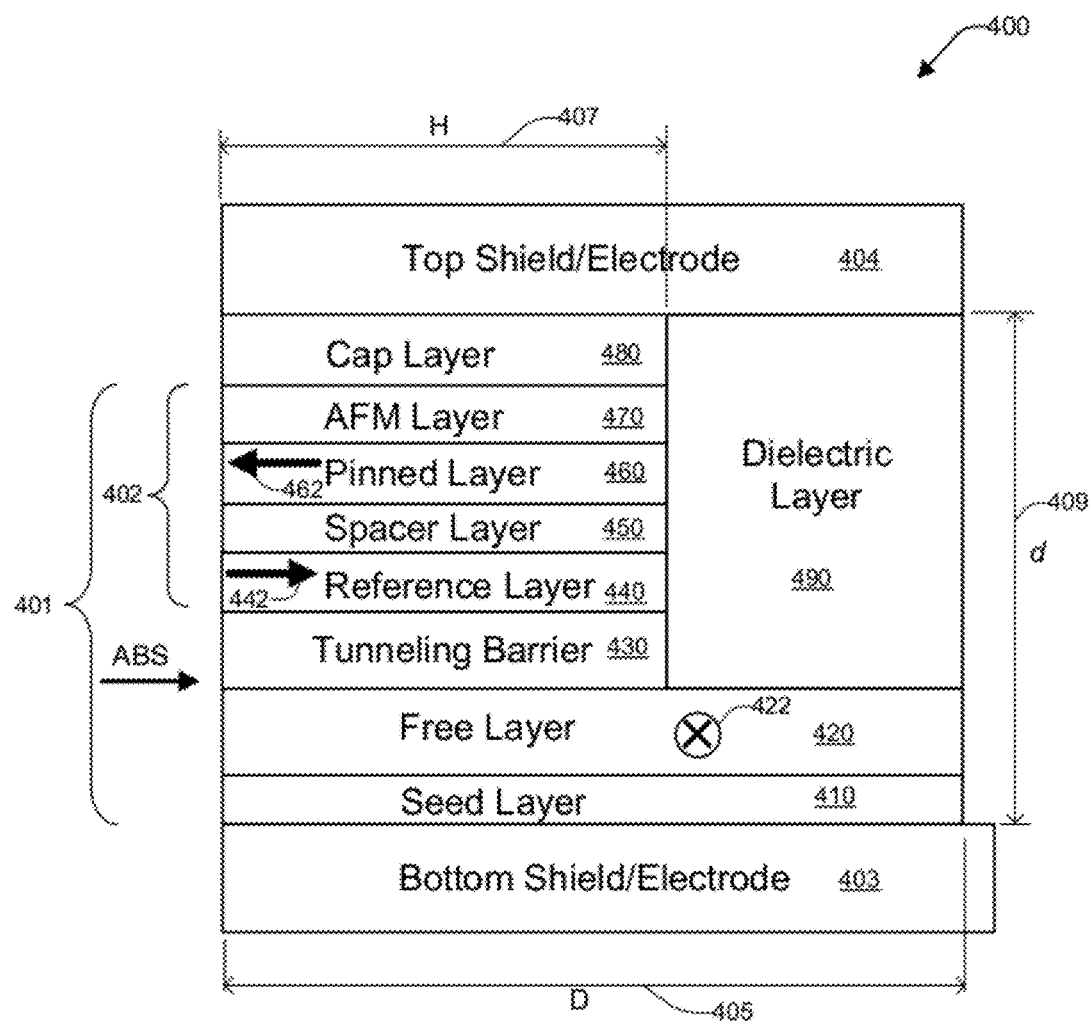
FIG. 4 is a diagram depicting a TMR read head having a novel TMR sensing element having differential stripe heights according to one aspect of the subject disclosure.

FIG. 4 is a diagram depicting a TMR read head 400 that includes a novel TMR sensing element 401 (e.g., the TMR sensing element 300) having differential stripe heights according to one aspect of the subject disclosure. The TMR read head 400 includes a bottom shield/electrode 403, a sensor stack 401 disposed over the bottom shield/electrode 403, a cap layer 480 disposed over the sensor stack 401, and a top shield/electrode 404 disposed over the cap layer 480. The distance (d) 409 between the to and bottom shields/electrodes 403, 404 define the shield-to-shield spacing for the TMR read head 400. For simplicity, FIG. 4 is not drawn to scale. The sensor stack 401 includes a seed layer 410 disposed over the bottom shield/electrode 403, a free layer 420 disposed over the seed layer 410, a tunneling barrier layer 430 disposed over the free layer 420, and a pinned stack 402 disposed over the tunneling barrier layer 430.

While each of the layers 410-480 and the stack 402 was described above as being "disposed over" a previous layer (e.g., the pinned stack 402 disposed over the tunneling barrier layer 403) for the illustrated embodiment of FIG. 4, it shall be appreciated that, in other embodiments, each of the layers 410-480 may be disposed below or aside or otherwise adjacent to a side of the previous layer depending on the orientation and arrangement of the TMR read head or the fabrication process for producing the TMR read head. Furthermore, as used herein, the phrase "Layer X disposed over (below, aside, or adjacent to a side of) Layer Y" encompasses those arrangements or embodiments in which there is one or more intermediate layers disposed between the Layer X and the Layer Y. For example, the phrase "the pinned stack 402 disposed adjacent to a second side of the free layer 420" permits the possibility that the tunneling barrier layer 430 and/or other layers may be present between the free layer 420 and the pinned stack 402.

The TMR read head 400 further includes a dielectric layer 490 abutting the side walls of the pinned stack 402 and the cap layer 480. The free layer 430 (and the seed layer 410) has a free layer stripe height (D) 405, and the pinned stack 402 has a current path stripe height (H) 407. In the illustrated example, the free layer stripe height (D) 405 is substantially (more than 50%) larger than the current path stripe height (H) 407. In other embodiments, D 405 is larger than H 407 by a smaller percentage (e.g., 20%) or a larger percentage (e.g., 100%).

The tunneling barrier 430 comprises a thin layer of an insulating material such as a crystalline magnesium oxide (MgO) that allows an electron to tunnel between the bottom and top electrodes 403, 404. In addition, although not explicitly shown in FIG. 1, the tunneling barrier layer 430 can include a thin conductive layer comprising a metal, such as Cu, Mg or Pt, disposed between the pinned stack 402 and the insulating material (e.g., MgO). In the illustrated example, the pinned stack 402 is a synthetic antiferromagnet having a number of magnetic layers including a reference layer 440 disposed over the tunneling barrier layer 430, a spacer layer 450 disposed over the reference layer 440, a pinned layer 460 disposed over the spacer layer 450, and a pinning or anti-ferromagnetic (AFM) layer 470 disposed over the pinned layer 460, and a cap layer 470 disposed over the AFM layer 470. In the reference layer 440 is a magnetization or moment 442 that has a first direction (e.g., to the right). In the pinned layer 460 is a magnetization or moment 462 that has a second direction (e.g., to the left). The spacer layer 450, comprised of a thin nonmagnetic conductive material such as ruthenium (Ru), provides a physical separation between the reference layer 440 and the pinned layer 460. The cap layer 480 can be formed of a material such as Ta.

The magnetizations or moments 442, 462 of the pinned layer 460 and the reference layer 440 of the pinned stack 402 are substantially fixed, or pinned. The free layer 420 may have a magnetization or moment 422 that may move, or switch. The pinning or AFM layer 470 is configured to fix the magnetization of the pinned stack 402 by fixing the magnetization or moment 462 of the pinned layer 460 in a particular direction, typically via an exchange-bias interaction. However, the magnetization or moment of the free layer 430 may move, or switch, in response to an external field such as of the magnetic flux ($\Phi$) 109 emanating from the magnetic media (FIG. 3).

The electrical resistance through the tunneling barrier layer 430 varies with the relative orientation of the free layer magnetization 422 compared with the reference layer magnetization 442 and thereby converts magnetic signals into electrical signals. When a sense current is passed from the bottom shield/electrode 403 to the top shield/electrode 404 in a direction perpendicular to the planes of the TMR layers (CPP designation), a lower resistance is detected when the magnetization directions of the free and reference layers are in a parallel state ("1" memory state) and a higher resistance is detected when the magnetization directions are in an anti-parallel state ("0" memory state). Alternatively, a TMR read head may be configured as a current in plane (CIP) structure which indicates the direction of the sense current.

Figure 5A:
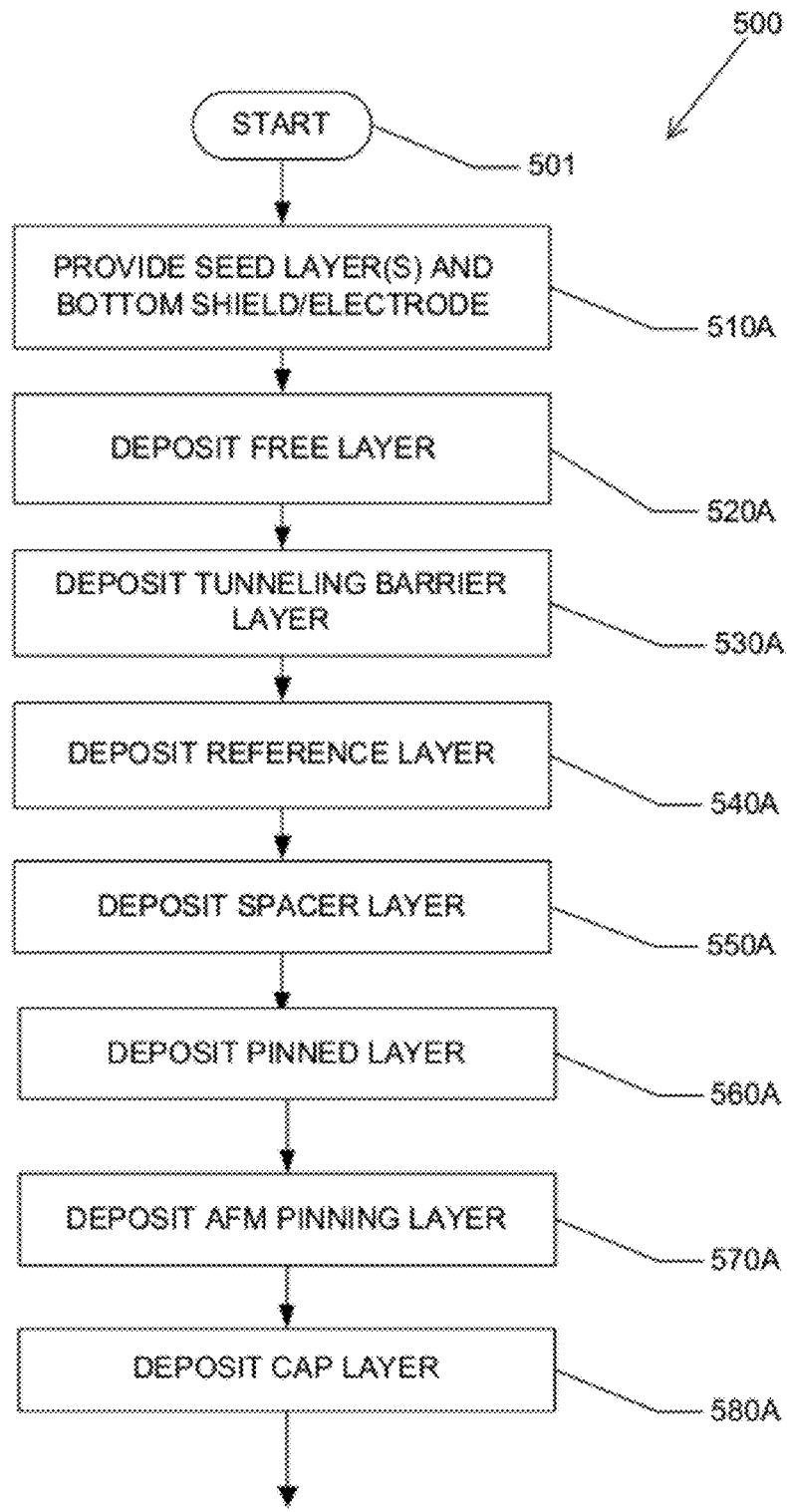
FIGS. 5A, 5B and 5C provide a flowchart illustrating an exemplary process for fabricating a TMR read head having differential stripe heights according to one aspect of the subject disclosure.
Figure 5B:
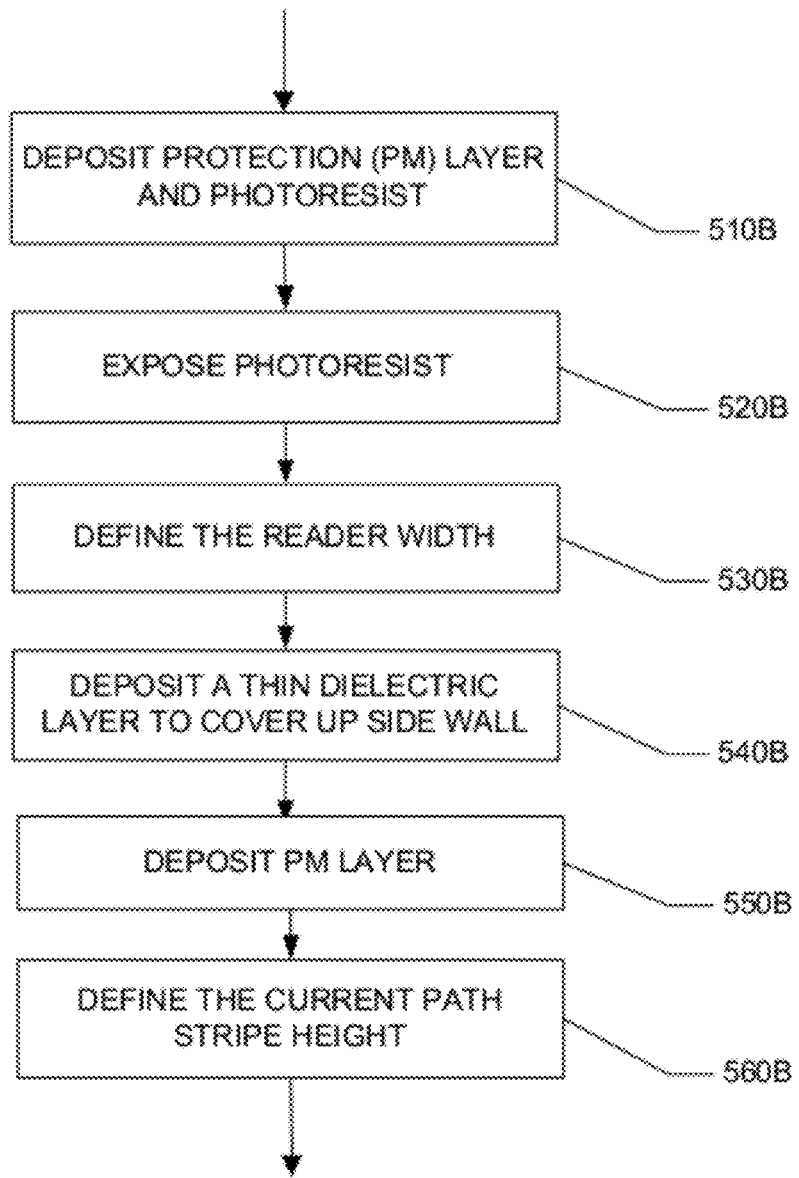
Figure 5C:
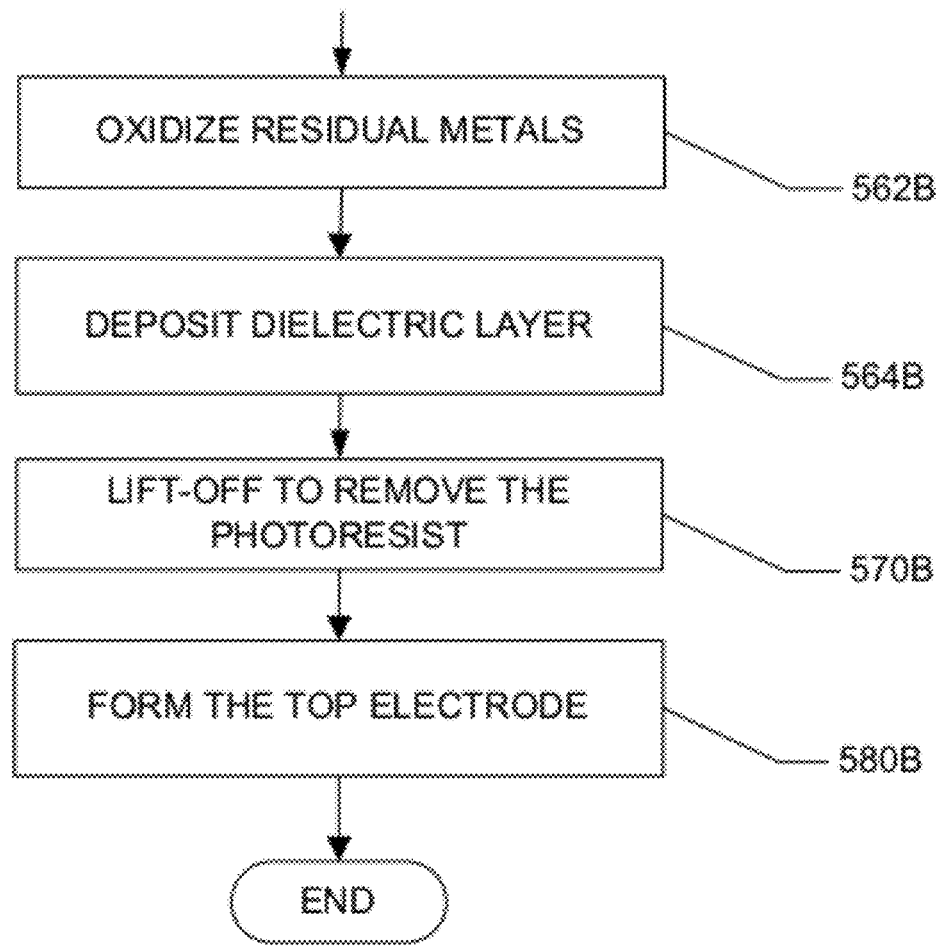

FIGS. 5A, 5B, and 5C provide a flowchart illustrating an exemplary process 500 for fabricating a TMR read head having differential stripe heights, such as the TMR read head 400, according to one aspect of the subject disclosure. For the purpose of illustration only, the process 500 will be described with references to elements of the TMR read head 400 of FIG. 4. First, the layers 403, 410-480 (FIG. 4) are deposited. Referring to FIG. 5A, the process 500 begins at start state and proceeds operation 510A in which the bottom shield/electrode 403 and the seed layer 410 are provided. The process 500 proceeds to operation 520A in which the free layer 420 is deposited over the seed layer 420. The process 500 proceeds to operation 530A in which the tunneling barrier layer 430 is deposited over the free layer 420.

After deposition of the tunneling barrier layer 430, the process 500 proceeds to operations for depositing various layers of the pinned stack 402 starting with operation 540A in which the reference layer 440 is deposited over the tunneling barrier layer 430. The process 500 proceeds to operation 550A in which a material (e.g., Ru) for the spacer layer 450 is deposited over the reference layer 440. The process 500 proceeds to operation 560A in which the pinned layer 460 is deposited over the spacer layer 450. The process 500 proceeds to operation 570 in which a material (e.g., IrMn or PtMn) for the AFM layer 470 is deposited over the pinned layer 460. After the depositions of the layers 440-470 of the pinned stack 402, the process 500 proceeds to operation 580 in which the cap layer 480 is deposited over the AFM layer 470. It is noted that the layers 430-480 are deposited over the free layer 420 over its entire stripe height, namely, D 405. It shall be appreciated that while each of various layers 403, 410-480 is referred to as "a layer", each of the layers may comprise multiple sub-layers. For example, the free layer 420 typically includes multiple sub-layers comprised of different magnetic materials.

Figure 6:
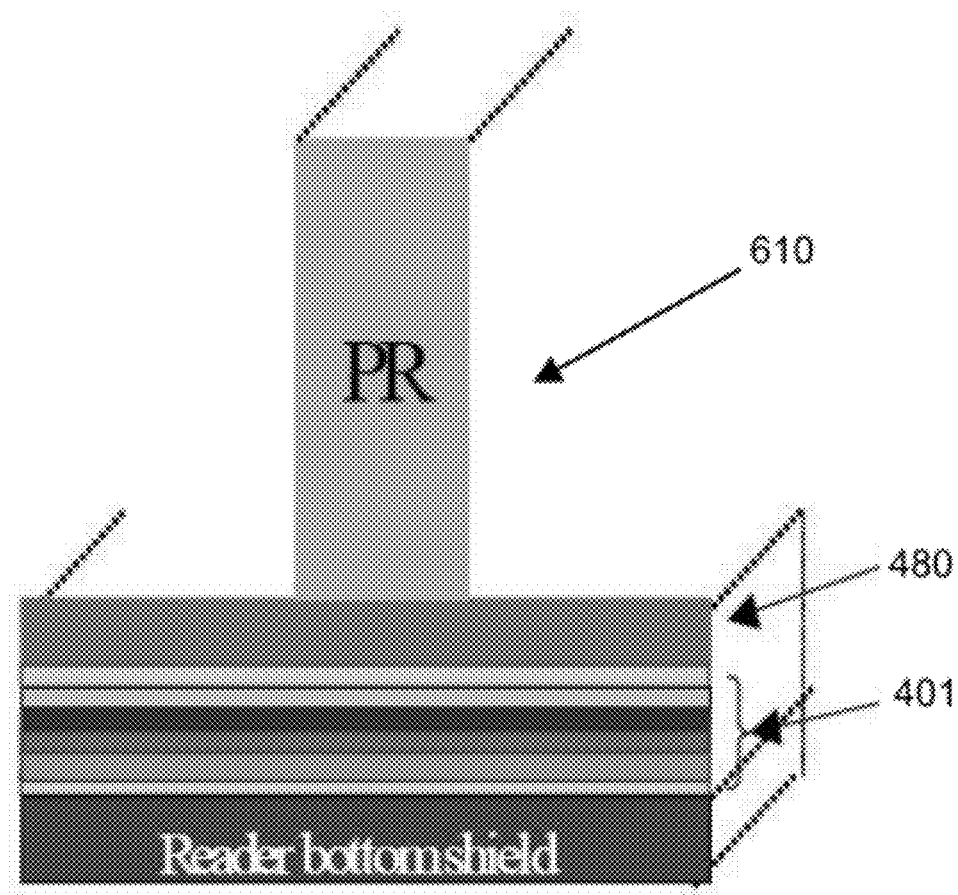
FIG. 6 is an intermediate structure that defines a reader width for a TMR read head having differential stripe heights according to one aspect of the subject disclosure.

After the depositions of the layers 403, 410-480, portions of the layers 430-480 are removed to define the reader's width and differential stripe heights. Referring to FIG. 5B, the process 500 proceeds to operation 510B in which a protection (PR) layer (e.g., a thin amorphous carbon layer) and a photoresist layer are deposited over the cap layer 480. The process 500 proceeds to operation 520B in which a certain portion of the photoresist is exposed, e.g., by an ultraviolet light. The process 500 proceeds to 530B in which unexposed portions of the photoresist and portions of the PR layer underlying the unexposed photoresist portions are removed, e.g., by an etching process (e.g., a dry milling process) to define the reader width as shown in FIG. 6. The process 500 proceeds to operation 540B in which a thin (e.g., in a range of between about 2 and 20 Å) dielectric layer is deposited to cover up the side walls of the PR layer 610. The process 500 proceeds to operation 550B in which a permanent magnet (PM) layer (not shown) is deposited. The process 500 proceeds to operation 560B in which the current path stripe height (H) 407 is defined by removing (e.g., by a milling process) selected portions of the layers 430-480 (e.g., the portions not covered by the remaining PR layer 610).

The removal (e.g., milling) process can be stopped at different points. For example, in certain embodiments, the removal process is stopped after removal of a portion of the tunneling barrier layer 430 resulting in a structure as shown in FIG. 4 in which case all layers above the free layer 420 including the tunneling barrier layer 430 have a stripe height (H) that is substantially less than the free layer stripe height (D) 405. In other embodiments, the removal process is stopped after removal of a portion of the spacer (e.g., Ru) layer 450 in which case the reference layer 440 and the tunneling barrier layer 430 may have a stripe height that is same as the free layer stripe height D 405 and the layers 450-470 of the pinned stack 402 have a current path stripe height (H) that is substantially smaller than D 405. In yet other embodiments, the removal process is such that various layers of the pinned stack 402 may have different current path stripe heights.

Referring to FIG. 5C, the process 500 proceeds to operation 562B in which any residual metals remaining on a newly exposed surface of the selected portions of the layers 430-480 created by the operation 560B are oxidized by exposing the surface to oxygen gas. After the oxidation of the residual metals, the process 500 proceeds to operation 564B in which a dielectric material (e.g., $AlO_2$) is deposited to refill a void created by the removal operation 560B. In the process, the dielectric layer 490 is formed. The process 500 proceeds to operation 570B in which the remaining exposed photoresist is removed by a lift-off process. The process 500 proceeds to operation 580B in which the top shield/electrode 404 is formed over the pinned stack 402 and the dielectric layer 490.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments of the invention described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A tunneling magnetoresistance (TMR) read head comprising:
    a free layer having a free layer stripe height, the free layer having a first side and a second side;
    a pinned stack disposed adjacent to the first side of the free layer, the pinned stack comprising at least one magnetic layer having a current path stripe height that is less than the free layer stripe height; and
    a dielectric layer disposed adjacent to the at least one magnetic layer and above an area of the free layer not having the pinned stack disposed thereover.

2. The TMR read head of claim 1, wherein the pinned stack comprises a reference layer, a pinned layer, and an antiferromagnetic layer.

3. The TMR read head of claim 2, wherein, in the pinned stack, the at least one magnetic layer having the current path strip is the reference layer.

4. The TMR read head of claim 2, wherein each of the reference, pinned and antiferromagnetic layers has a stripe height that is substantially equal to the current path stripe height.

5. The TMR read head of claim 4 further comprising a tunneling barrier layer disposed between the free layer and the pinned stack and having a stripe height substantially equal to the current path stripe height.

6. The TMR read head of claim 5 further comprising a first shield disposed below the free layer and a second shield disposed above the pinned stack, each of the first and second shields having a stripe height substantially equal to the free layer stripe height.

7. The TMR read head of claim 1, wherein a ratio of the current path stripe height to the free layer stripe height is less than 0.5.

8. A tunneling magnetoresistance (TMR) read head comprising:
    a free layer having a free layer stripe height, the free layer having a first side and a second side; and
    a pinned stack disposed adjacent to the first side of the free layer, the pinned stack comprising at least one magnetic layer having a current path stripe height that is less than the free layer stripe height,
    the pinned stack having a first surface disposed proximate to a magnetic recording medium and a second surface disposed opposite to the first surface at the current path stripe height from the first surface, wherein a magnetic flux emanating from the magnetic recording medium has a first magnetic flux value at the first surface and a second magnetic flux value at the second surface, further wherein a ratio of the second magnetic flux value to the first magnetic flux value is greater than 0.5.

9. The TMR read head of claim 8 further comprising a nonmagnetic insulating material disposed between the first and second shields and abutting the second surface of the pinned stack, the nonmagnetic insulating material extending from the current path stripe height to the free layer stripe height.

10. A hard disk drive comprising the TMR read head of claim 1.

11. A method of producing a tunneling magnetoresistance (TMR) read head, the method comprising:
    providing a free layer having a free layer stripe height, the free layer having a first side and a second side;
    forming a tunneling barrier layer adjacent to the first side of the free layer, the tunneling barrier layer having a first side and a second side, the second side of the tunneling barrier layer facing the first side of the free layer;
    forming a pinned stack adjacent to the first side of the tunneling barrier layer, the pinned stack comprising at least one magnetic layer having a current path stripe height that is less than the free layer stripe height; and
    forming a dielectric layer adjacent to the at least one magnetic layer and above an area of the free layer not having the pinned stack disposed thereover.

12. The method of claim 11, wherein a ratio of the current path stripe height to the free layer stripe height is less than 0.5.

13. The method of claim 11, wherein the tunnel barrier layer has a stripe height substantially equal to the free layer stripe height.

14. The method of claim 11, wherein the pinned stack comprises a reference layer, a pinned layer, and an antiferromagnetic layer.

15. The method of claim 14, wherein at least the reference layer has the current path stripe height.

16. The method of claim 11, wherein forming the pinned stack comprises forming an initial pinned stack having a stripe height substantially equal to the free layer stripe height.

17. The method of claim 16, wherein removing a portion of the initial pinned stack to form the pinned stack having the current path stripe height.

18. The method of claim 16 further comprising forming a nonmagnetic insulating material adjacent to the pinned stack.

19. The method of claim 17, wherein the nonmagnetic insulating material comprises aluminum oxide ($Al_2O_3$).

20. The method of claim 17 further comprising forming a shield layer over the pinned stack and the nonmagnetic insulating material.

* * * * *